US012756404B2

(12) United States Patent
Maeng et al.

(10) Patent No.: US 12,756,404 B2
(45) Date of Patent: Oct. 6, 2026

(54) SAMPLE-AND-HOLD CIRCUIT AND ANALOG-TO-DIGITAL CONVERTER CIRCUIT INCLUDING THE SAME

(71) Applicant: SAMSUNG ELECTRONICS CO., LTD., Suwon-si (KR)

(72) Inventors: Jun Young Maeng, Suwon-si (KR); Jae Woo Park, Suwon-si (KR); Seung Yeob Baek, Suwon-si (KR); Myoung Bo Kwak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 18/762,277

(22) Filed: Jul. 2, 2024

(65) Prior Publication Data

US 2025/0219655 A1 Jul. 3, 2025

(30) Foreign Application Priority Data

Jan. 2, 2024 (KR) ........................ 10-2024-0000414

(51) Int. Cl.
*H03M 1/00* (2006.01)
*H03M 1/12* (2006.01)
*H03M 3/02* (2006.01)

(52) U.S. Cl.
CPC .................................... *H03M 3/02* (2013.01)

(58) Field of Classification Search
CPC ...... H03M 3/02; H03M 1/1245; H03M 1/121; H03M 1/183
USPC .......................................................... 341/122
See application file for complete search history.

(56) References Cited

U.S. PATENT DOCUMENTS

| | | | | |
|---|---|---|---|---|
| 6,998,917 | B2 | 2/2006 | Kudo et al. | |
| 7,154,334 | B2 | 12/2006 | Dyer et al. | |
| 8,330,536 | B1 * | 12/2012 | Quinn | H03F 3/45977 330/109 |
| 8,599,053 | B2 | 12/2013 | Quiquempoix et al. | |
| 11,265,008 | B2 * | 3/2022 | Alhoshany | H03M 3/426 |
| 11,502,695 | B2 | 11/2022 | Weng et al. | |
| 11,588,482 | B1 * | 2/2023 | Tsen | H03K 17/6871 |
| 2016/0352372 | A1 * | 12/2016 | Gorecki | H03G 3/20 |
| 2017/0104480 | A1 * | 4/2017 | Eshel | G11C 27/026 |

FOREIGN PATENT DOCUMENTS

| | | |
|---|---|---|
| JP | 2016225951 | 12/2016 |
| KR | 20030094463 | 12/2003 |
| KR | 20080007997 | 1/2008 |

* cited by examiner

*Primary Examiner* — Jean B Jeanglaude
(74) *Attorney, Agent, or Firm* — Fish & Richardson P.C.

(57) ABSTRACT

A sample-and-hold circuit includes first and second differential input terminals receiving distinct first and second differential input voltages. The sample-and-hold circuit also includes first and second unity gain buffers receiving, respectively, the first and second differential input voltages from the first and second differential input terminals. The sample-and-hold circuit includes an amplifier comparing received voltages and amplifying results of the comparison. The amplifier generates a feedback voltage which regulates outputs of the first and second unity gain buffers. The feedback voltage is based on a reference voltage and a common mode voltage that is provided from the first and second unity gain buffers.

18 Claims, 11 Drawing Sheets

100b

SAMPLE-AND-HOLD CIRCUIT AND ANALOG-TO-DIGITAL CONVERTER CIRCUIT INCLUDING THE SAME

CROSS-REFERENCE TO RELATED APPLICATION

This application claims priority from Korean Patent Application No. 10-2024-0000414, filed on Jan. 2, 2024 in the Korean Intellectual Property Office, and all the benefits accruing therefrom under 35 U.S.C. 119, the contents of which are herein incorporated by reference in its entirety.

BACKGROUND

In device interface circuits, as the amount of data to be processed continues to increase, the data transmission speed is becoming faster. The faster the data transmission speed, the greater the potential increase in signal loss and distortion in the channel through which data is moving. For high-speed serializer-deserializer (SerDes) receivers, there may be limitations in equalizing processes that correct signal loss and distortion through analog equalizers. Therefore, there may be a need for equalization in the digital domain as well. For this purpose, it may be necessary to improve the signal-to-noise ratio (SNR) performance of analog-to-digital converters (ADCs) that constitute the receivers.

SUMMARY

Aspects of the present disclosure provide a sample-and-hold circuit with an improved performance.

Aspects of the present disclosure also provide an analog-to-digital converter (ADC) circuit including a sample-and-hold circuit with an improved performance.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to aspects of the present disclosure, a sample-and-hold circuit comprises a first differential input terminal receiving a first differential input voltage among multiple differential input voltages, a second differential input terminal receiving a second differential input voltage among the multiple differential input voltages, which is different from the first differential input voltage, a first unity gain buffer receiving the first differential input voltage from the first differential input terminal and outputting a first differential output voltage to a first differential output terminal, a second unity gain buffer receiving the second differential input voltage from the second differential input terminal and outputting a second differential output voltage to a second differential output terminal and an amplifier comparing received voltages and amplifying results of the comparison, wherein the amplifier generates a feedback voltage, which regulates outputs of the first and second unity gain buffers based on a reference voltage and a common mode voltage that is provided from the first and second unity gain buffers and a reference voltage.

According to other aspects of the present disclosure, there is provided a sample-and-hold circuit comprises a first differential input terminal receiving a first differential input voltage among differential input voltages, a second differential input terminal receiving a second differential input voltage among the multiple differential input voltages, which is different from the first differential input voltage, a first unity gain buffer receiving the first differential input voltage from the first differential input terminal and outputting a first differential output voltage to a first differential output terminal, a second unity gain buffer receiving the second differential input voltage from the second differential input terminal and outputting a second differential output voltage to a second differential output terminal, a first feedback switch having one terminal connected to an output terminal of the first unity gain buffer, a second feedback switch having one terminal connected to an output terminal of the second unity gain buffer and the other terminal connected to the first feedback switch and an amplifier having a first input terminal connected to the first and second feedback switches, a second input terminal receiving a reference voltage, and an output terminal outputting a feedback voltage that regulates outputs of the first and second unity gain buffers.

According to aspects of the present disclosure, there is provided an analog-to-digital converter (ADC) circuit comprises a plurality of sub-ADCs converting analog signals into digital signals in a time-interleaving method and a sample-and-hold circuit repeatedly sampling and buffering a first differential input voltage among multiple differential input voltages, by using a first unity gain buffer, and repeatedly sampling and buffering a second differential input voltage among the multiple differential input voltages, which is different from the first differential input voltage, by using a second unity gain buffer, wherein in response to the first and second differential input voltages being sampled, the sample-and-hold circuit inputs a common mode voltage, which is generated from the first and second differential input voltages by the first and second unity gain buffers, to an amplifier and regulates outputs of the first and second unity gain buffers based on the common mode voltage and a reference voltage, and in response to the first and second differential input voltages being buffered, the sample-and-hold circuit provides the regulated outputs of the first and second unity gain buffers to the sub-ADCs.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary implementations thereof with reference to the attached drawings, in which.

DETAILED DESCRIPTION

Implementations of the present disclosure will hereinafter be described with reference to the accompanying drawings.

Figure 1:
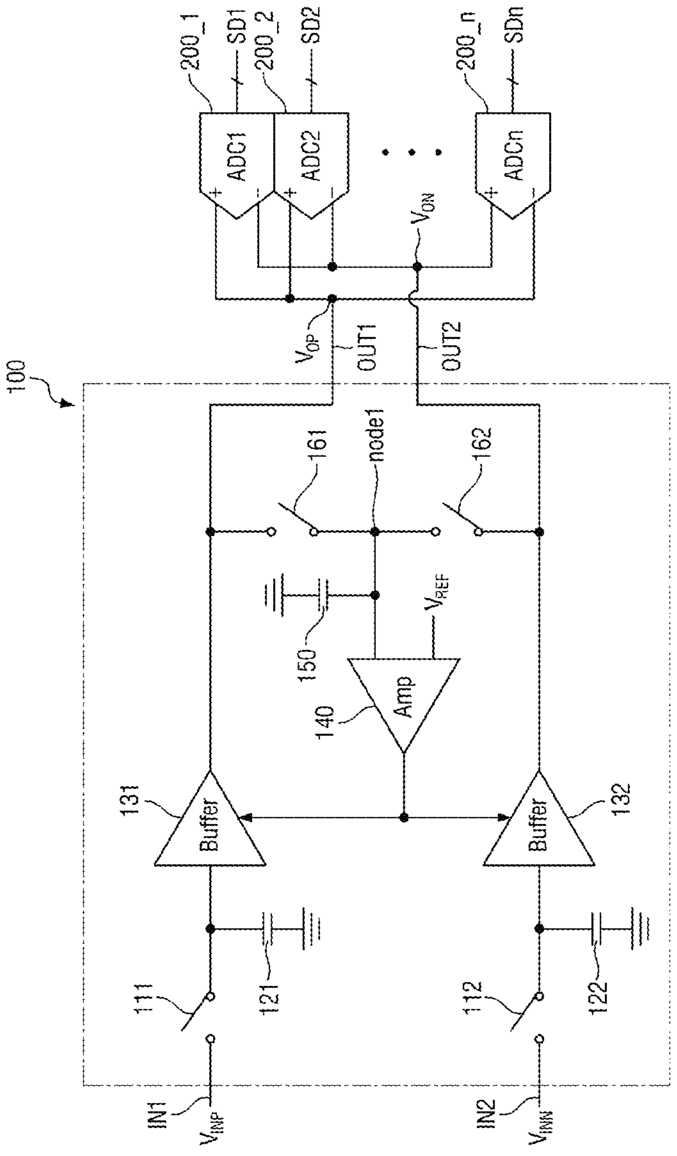
FIG. 1 is a circuit diagram of an example sample-and-hold circuit.

FIG. 1 is a circuit diagram of a sample-and-hold circuit.

Referring to FIG. 1, a sample-and-hold circuit 100 may include first and second differential input terminals IN1 and IN2, first and second differential output terminals OUT1 and OUT2, first and second sampling switches 111 and 112, first and second unity gain buffers 131 and 132, first and second feedback switches 161 and 162, and an amplifier 140. First and second differential input voltages $V_{INP}$ and $V_{INN}$, which are different from each other, may be input to the first and second differential input terminals IN1 and IN2, respectively.

The first and second sampling switches 111 and 112 may electrically connect or disconnect the first and second differential input terminals IN1 and IN2, respectively, to the first and second unity gain buffers 131 and 132, respectively. Each of the first and second sampling switches 111 and 112 may include one or more transistors that operate by receiving a clock signal from an external source. The transistors included in each of the first and second sampling switches 111 and 112 may be configured as p- or n-type metal-oxide semiconductor field-effect transistors (MOSFETs). When the first and second sampling switches 111 and 112 are closed, the first and second differential input voltages $V_{INP}$ and $V_{INN}$ may be input to the first and second unity gain buffers 131 and 132, respectively.

In some implementations, the sample-and-hold circuit 100 may further include first and second sampling capacitors 121 and 122, which are connected between the first and second sampling switches 111 and 112, respectively, and the first and second unity gain buffers 131 and 132, respectively. The first and second sampling capacitors 121 and 122 may sample the first and second differential input voltages $V_{INP}$ and $V_{INN}$ when the first and second sampling switches 111 and 112 are closed. The first and second sampling capacitors 121 and 122 may provide the sampled voltages to the first and second unity gain buffers 131 and 132 when the first and second sampling switches 111 and 112 are open. FIG. 1 illustrates two sampling switches, i.e., the first and second sampling switches 111 and 112, but alternatively, the sample-and-hold circuit 100 may include more than two, or less than two sampling switches.

Unity gain buffers are ideal buffers with a gain of 1. The first and second unity gain buffers 131 and 132 may receive the first and second differential input voltages $V_{INP}$ and $V_{INN}$ or the voltages sampled by the first and second sampling capacitors 121 and 122 as inputs and may output the first and second differential output voltages $V_{OP}$ and $V_{ON}$ to the first and second differential output terminals OUT1 and OUT2, respectively. The transistors included in each of the first and second unity gain buffers 131 and 132 may be configured as p- or n-type MOSFETs. Here, the first and second unity gain buffers 131 and 132 are described as being, for example, source followers, but may also take various other forms than source followers. FIG. 1 illustrates two unity gain buffers, i.e., the first and second unity gain buffers 131 and 132, but alternatively, the sample-and-hold circuit 100 may include more than two, or less than two, unity gain buffers.

Each of the first and second feedback switches 161 and 162 may include one or more transistors that operate by receiving a clock signal from an external source. The transistors included in each of the first and second feedback switches 161 and 162 may be configured as p- or n-type MOSFETs. The first feedback switch 161 may be connected in series to the first unity gain buffer 131. The second feedback switch 162 may be connected in series to the second unity gain buffer 132 and the first feedback switch 161.

A first node node1 may be disposed between the first and second feedback switches 161 and 162, which are connected in series. When the first and second feedback switches 161 and 162 are closed, the output terminals of the first and second unity gain buffers 131 and 132 may be shorted. When the first and second feedback switches 161 and 162 are closed, a common mode voltage may be generated at the first node node1.

In some implementations, the sample-and-hold circuit 100 may further include a feedback capacitor 150, which is connected between the first node node1 and the amplifier 140. When the first and second feedback switches 161 and 162 are closed, the feedback capacitor 150 may store the common mode voltage generated at the first node node1. When the first and second feedback switches 161 and 162 are open, the feedback capacitor 150 may provide the stored common mode voltage to the amplifier 140.

The amplifier 140 may have two input terminals. The amplifier 140 may be connected to the first node node1 and may thereby receive a voltage from the first node node1 or from the feedback capacitor 150. The amplifier 140 may receive a reference voltage $V_{REF}$ from a voltage source (not illustrated) connected externally or internally to the sample-and-hold circuit 100. The amplifier 140 may compare the two received voltages and output a feedback voltage. The amplifier 140 may be, for example, an operational amplifier (OP Amp), but the present disclosure is not limited thereto. The amplifier 140 may provide the feedback voltage to the first and second unity gain buffers 131 and 132. Therefore, the amplifier 140 may regulate the outputs of the first and second unity gain buffers 131 and 132 based on the feedback voltage.

Figure 2:
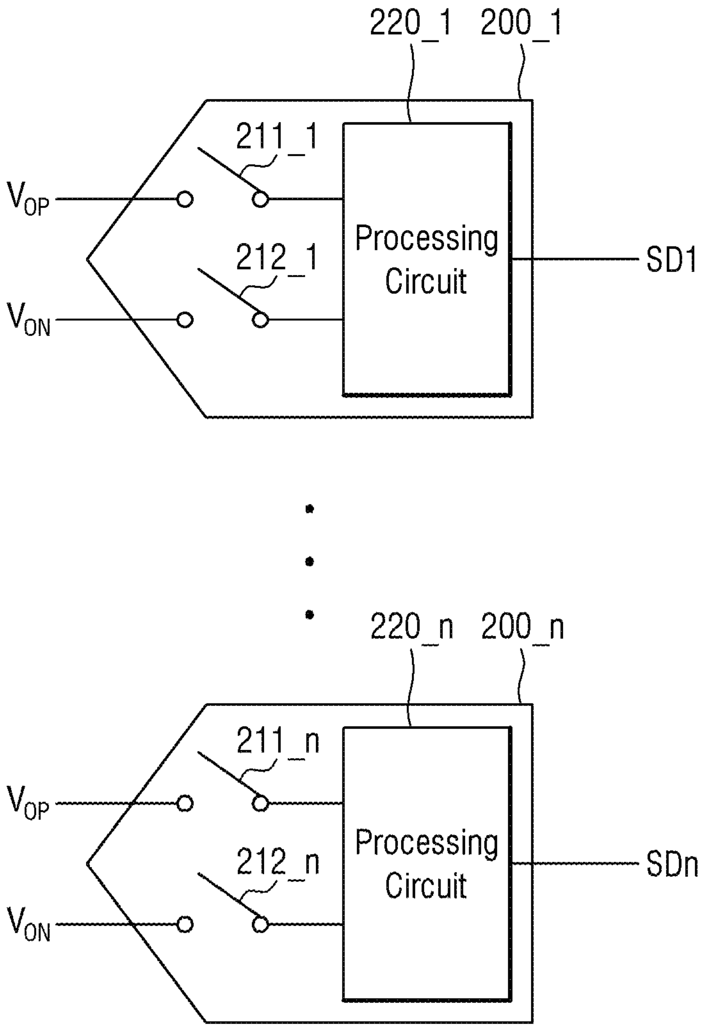
FIG. 2 is a circuit diagram illustrating a plurality of analog-to-digital converters (ADCs) connected to the sample-and-hold circuit.

FIG. 2 is a circuit diagram illustrating a plurality of analog-to-digital converters (ADCs) connected to the sample-and-hold circuit.

Referring to FIG. 2, a plurality of ADCs 200_1 through **200_*n* may be connected to output terminals OUT1 and OUT2 of the sample-and-hold circuit 100 of FIG. 1. The ADCs 200_1 through 200_*n* may convert analog signals received in a time-interleaving manner into digital signals based on the first and second differential output voltages $V_{OP}$ and $V_{ON}$ from the first and second unity gain buffers 131 and 132 of the sample-and-hold circuit 100 of FIG. 1. The ADCs 200_1 through 200_*n* may be referred to as time-interleaved (TI) ADCs or sub-ADCs. The ADCs 200_1 through 200_*n* may process the signals received through the sample-and-hold circuit 100 of FIG. 1 based on clock signals with different phases and may output sample data SD1 through SDn. The received signals may be analog signals, and the sample data SD1** through SDn may be digital signals corresponding to the received signals.

The analog-to-digital converters 200_1 through **200_*n* may include converter switches 211_1 through 211_*n*, respectively, converter switches 212_1 to 212**_*n*, respectively, and processing circuits 220_1 through 220_*n*, respectively. When the converter switches 211_1 through 211_*n* and 212_1 through 212_*n* are closed, the ADCs 200_1 through 200_*n* may be electrically connected to the first and second unity gain buffers 131 and 132 of the sample-and-hold circuit 100 of FIG. 1 and may receive the first and second differential output voltages $V_{OP}$ and $V_{ON}$. When the converter switches 211_1 through 211_*n* and 212_1 through 212_*n* are open, the analog-to-digital converters 200_1 through 200_*n* and the first and second unity gain buffers 131 and 132 of the sample-and-hold circuit 100 of FIG. 1 may be electrically disconnected. The processing circuits 220_1 through 220_*n* may receive the first and second differential output voltages $V_{OP}$ and $V_{ON}$ from the converter switches 211_1 through 211_*n* and 212_1 through 212_*n* and may convert the first and second differential output voltages $V_{OP}$ and $V_{ON}$ into digital signals. The processing circuits 220_1 through 220_*n* may output the sample data SD1 through SDn that have been digitalized.

Figure 3:
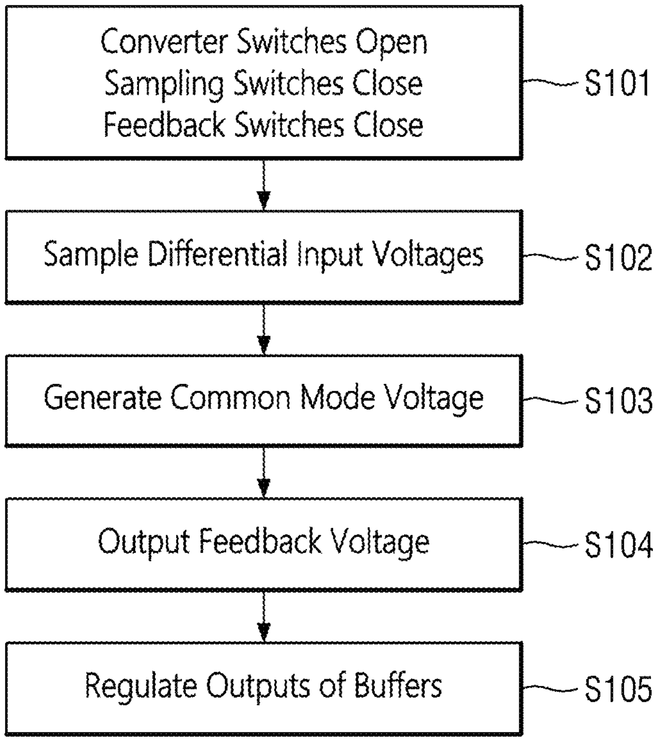
FIG. 3 is a flowchart for explaining the operation of the sample-and-hold circuit.
Figure 4:
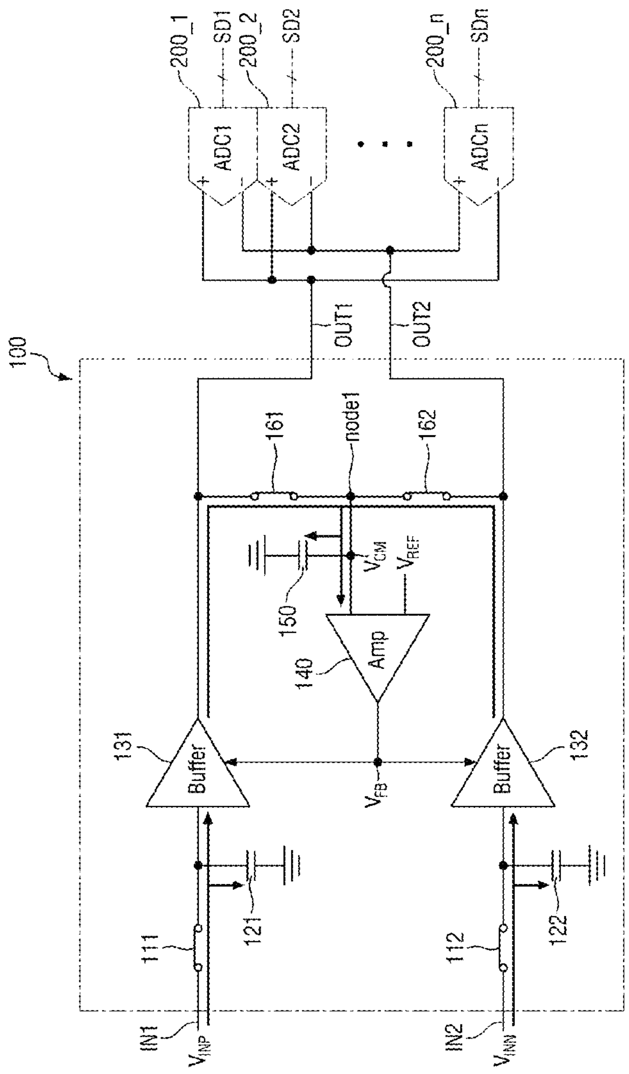
FIG. 4 is a circuit diagram for explaining the operation of the sample-and-hold circuit.

FIG. 3 is a flowchart for explaining the operation of the sample-and-hold circuit. FIG. 4 is a circuit diagram for explaining the operation of the sample-and-hold circuit.

FIGS. 3 and 4 illustrate an exemplary operation of the sample-and-hold circuit 100 during a first phase, which is the phase during which sampling is performed. Referring to FIGS. 3 and 4, in response to the first phase, the converter switches 211_1 through 211_*n* and 212_1 through 212_*n* of FIG. 2 may be open, and the first and second sampling switches 111 and 112 and the first and second feedback switches 161 and 162 may be closed (S101).

The converter switches 211_1 through 211_*n* and 212_1 through 212_*n* of FIG. 2 may be switches included in the ADCs 200_1 through 200_*n*, which are connected to the output of the sample-and-hold circuit 100. When the converter switches 211_1 through 211_*n* and 212_1 through 212_*n* of FIG. 2 are open, the first and second unity gain buffers 131 and 132 and the ADCs 200_1 through 200_*n* may be electrically disconnected.

When the first and second feedback switches 161 and 162 are closed, the output terminals of the first and second unity gain buffers 131 and 132 may be electrically connected, being shorted.

When the first and second sampling switches 111 and 112 are closed, the differential input terminals of the sample-and-hold circuit 100 and the first and second unity gain buffers 131 and 132 may be electrically connected.

With the first and second sampling switches 111 and 112 closed, the sample-and-hold circuit 100 may sample the first and second differential input voltages $V_{INP}$ and $V_{INN}$ (S102).

For example, the first differential input voltage $V_{INP}$ may be input to the first unity gain buffer 131 through the first differential input terminal IN1, and the second differential input voltage $V_{INN}$ may be input to the second unity gain buffer 132 through the second differential input terminal IN2. Additionally, the first differential input voltage $V_{INP}$ may be sampled by the first sampling capacitor 121, and the second differential input voltage $V_{INN}$ may be sampled by the second sampling capacitor 122. The output magnitude of the first unity gain buffer 131 may be influenced by the gain of the first unity gain buffer 131, the bias current flowing through the first unity gain buffer 131, and the internal resistance of circuit. The gain of the first unity gain buffer 131, the bias current flowing through the first unity gain buffer 131, and the internal resistance of circuit may vary due to process-voltage-temperature (PVT) variations, potentially leading to values different from those intended.

Assuming the first unity gain buffer 131 is a source follower, a voltage level of the output of the first unity gain buffer 131 may be shifted by a threshold voltage $V_{TH}$ of the internal transistors of the first unity gain buffer 131 based on a voltage level of the first differential input voltage $V_{INP}$. For example, if the direct current (DC) component of the first differential input voltage $V_{INP}$ is 0.4 V, the internal transistors of the source follower functioning as the first unity gain buffer 131 are p-type MOSFETs, and the threshold voltage $V_{TH}$ is 0.25 V, then the DC component of the output of the first unity gain buffer 131 may be about 0.65 V. However, the magnitude of the DC component of the output of the first unity gain buffer 131 may vary due to PVT variations. The same description may also be applicable to the second unity gain buffer 132.

As the output terminals of the first and second unity gain buffers 131 and 132 are electrically connected, a common mode voltage $V_{CM}$ may be generated at the first node node1 between the first and second feedback switches 161 and 162 (S103). The common mode voltage $V_{CM}$ may be input to the amplifier 140. The reference voltage $V_{REF}$ may be input to the amplifier 140 from the voltage source (not illustrated) connected externally or internally to the sample-and-hold circuit 100. The common mode voltage $V_{CM}$ may be stored in the feedback capacitor 150.

The amplifier 140 may output a feedback voltage $V_{FB}$ based on the reference voltage $V_{REF}$ and the common mode voltage $V_{CM}$ (S104). Specifically, the amplifier 140 may compare the magnitudes of the reference voltage $V_{REF}$ and the common mode voltage $V_{CM}$ and output the feedback voltage $V_{FB}$ by amplifying the result of the comparison.

The feedback voltage $V_{FB}$ may regulate the outputs of the first and second unity gain buffers 131 and 132 (S105). Specifically, the feedback voltage $V_{FB}$ may regulate the outputs of the first and second unity gain buffers 131 and 132 to match the magnitude of the common mode voltage $V_{CM}$ to that of the reference voltage $V_{REF}$. For example, the feedback voltage $V_{FB}$ may uniformly maintain the outputs of the first and second unity gain buffers 131 and 132 when the magnitudes of the common mode voltage $V_{CM}$ and the reference voltage $V_{REF}$ are equal. Moreover, the feedback voltage $V_{FB}$ may regulate the voltage generated at the output terminals of the first and second unity gain buffers 131 and 132 during the first phase, i.e., the common mode voltage $V_{CM}$, to have the same magnitude as the reference voltage $V_{REF}$ when the magnitudes of the common mode voltage $V_{CM}$ and the reference voltage $V_{REF}$ differ.

Assuming the first unity gain buffer 131 is a source follower, the feedback voltage $V_{FB}$, may regulate the output of the first unity gain buffer 131, for example, by adjusting the bias current of the source follower. However, the method by which the feedback voltage $V_{FB}$ regulates the output of the first unity gain buffer 131 may vary and is not particularly limited. The same description may also be applicable to the second unity gain buffer 132. Consequently, during the first phase, the magnitude of the common mode voltage $V_{CM}$ generated at the output terminals of the first and second unity gain buffers 131 and 132 may be maintained equal to the magnitude of the reference voltage $V_{REF}$.

Figure 5:
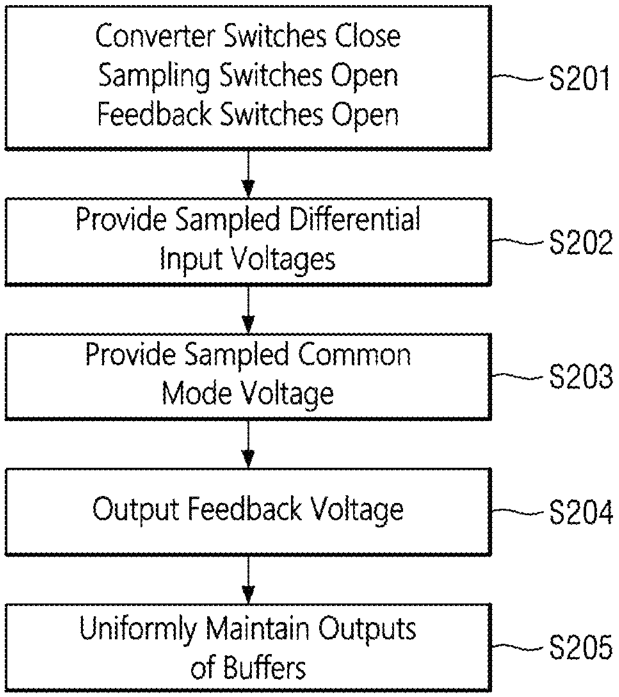
FIG. 5 is a flowchart for explaining the operation of the sample-and-hold circuit.
Figure 6:
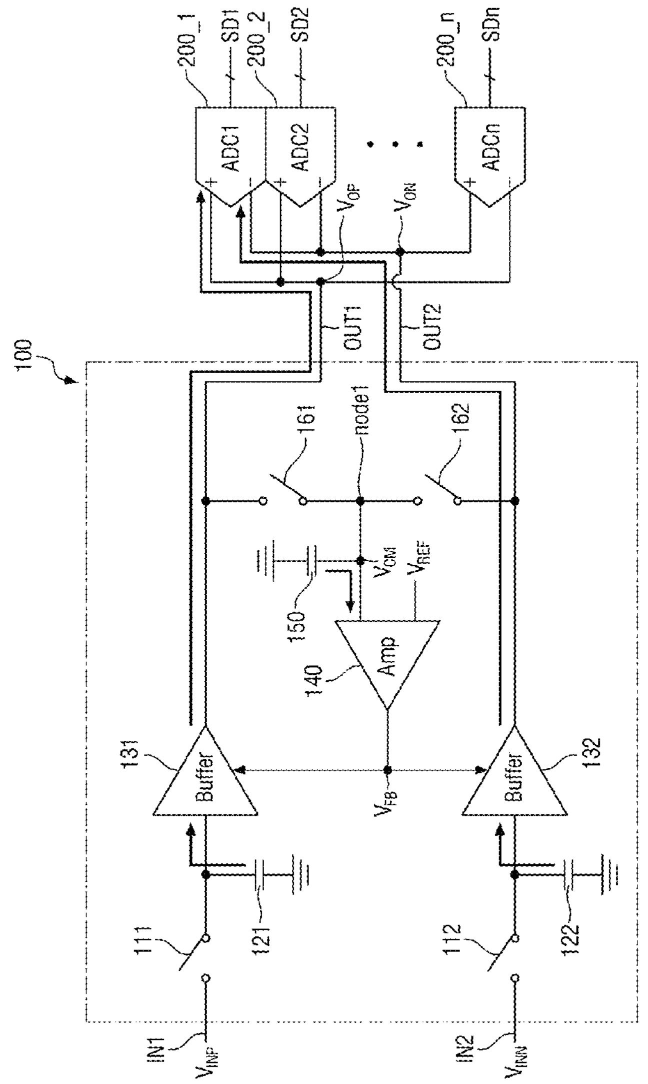
FIG. 6 is a circuit diagram for explaining the operation of the sample-and-hold circuit.

FIG. 5 is a flowchart for explaining the operation of the sample-and-hold circuit. FIG. 6 is a circuit diagram for explaining the operation of the sample-and-hold circuit.

FIGS. 5 and 6 illustrate the operation of the sample-and-hold circuit 100 during a second phase. Referring to FIGS. 5 and 6, the second phase may be the phase during which buffering is performed. In response to the second phase, the first and second feedback switches 161 and 162 and the first and second sampling switches 111 and 112 may be open, and the converter switches 211_1 through 211_*n* and 212_1 through 212_*n* of FIG. 2 may be closed (S201). Specifically, the first feedback switch 161, which is connected in series to the first unity gain buffer 131, and the second feedback switch 162, which is connected in series to the second unity gain buffer 132 and the first feedback switch 161, may be open. The first and second unity gain buffers 131 and 132 may be electrically disconnected, causing the first and second differential output voltages $V_{OP}$ and $V_{ON}$ to potentially differ. When the first and second sampling switches 111 and 112 are open, the differential input voltages $V_{INP}$ and $V_{INN}$ may not be input to the first and second unity gain buffers 131 and 132 from the first and second differential input terminals IN1 and IN2. As the converter switches 211_1 through 211_*n* and 212_1 through 212_*n* of FIG. 2 are closed, the first and second unity gain buffers 131 and 132 may be electrically connected to the ADCs 200_1 through 200_*n*.

The first and second sampling capacitors 121 and 122 may provide the sampled differential input voltages to the first and second unity gain buffers 131 and 132 (S202). Specifically, the first sampling capacitor 121 may provide the sampled first differential input voltage $V_{INP}$ to the first unity gain buffer 131. The second sampling capacitor 122 may provide the sampled second differential input voltage $V_{INN}$ to the second unity gain buffer 132.

The feedback capacitor 150 may provide the stored common mode voltage $V_{CM}$ to the amplifier 140 (S203). Even though the first and second feedback switches 161 and 162 are open, the amplifier 140 may output the feedback voltage $V_{FB}$ due to the feedback capacitor 150 (S204). The feedback voltage $V_{FB}$ may uniformly maintain the outputs of the first and second unity gain buffers 131 and 132 during the second phase. Consequently, during the second phase, the first and second unity gain buffers 131 and 132 may provide uniform outputs to the ADCs 200_1 through 200_*n* (S205).

The second phase, when buffering is performed, may follow the first phase, when sampling is performed. Once the second phase ends, the first phase may start again. In other words, the first and second phases may be sequentially performed, alternating with each other, and as a result, sampling and buffering may be alternately performed.

PVT variations may cause unintended changes in the outputs of unity gain buffers, and such changes in the first and second differential output voltages $V_{OP}$ and $V_{ON}$ may degrade the performance of ADCs. Therefore, it may be necessary to perform feedback using the reference voltage $V_{REF}$ to compensate for the changes in the first and second differential output voltages $V_{OP}$ and $V_{ON}$ in ADCs due to PVT variations. Additionally, it may be necessary to extract the common mode voltage $V_{CM}$ for feedback. When using passive elements such as resistors or capacitors to extract the common mode voltage $V_{CM}$, the bandwidth of extracted signals may decrease, which may become a hindrance to high-speed analog-to-digital conversion.

Since passive elements such as resistors or capacitors are not used to extract the common mode voltage $V_{CM}$, there is no risk of reduced bandwidth for extracted signals, thereby preventing performance degradation of ADCs that perform high-speed conversion. Consequently, an ADC capable of outputting improved-quality signals that are robust against PVT variations and also capable of performing rapid analog-to-digital conversion can be provided.

Figure 7:
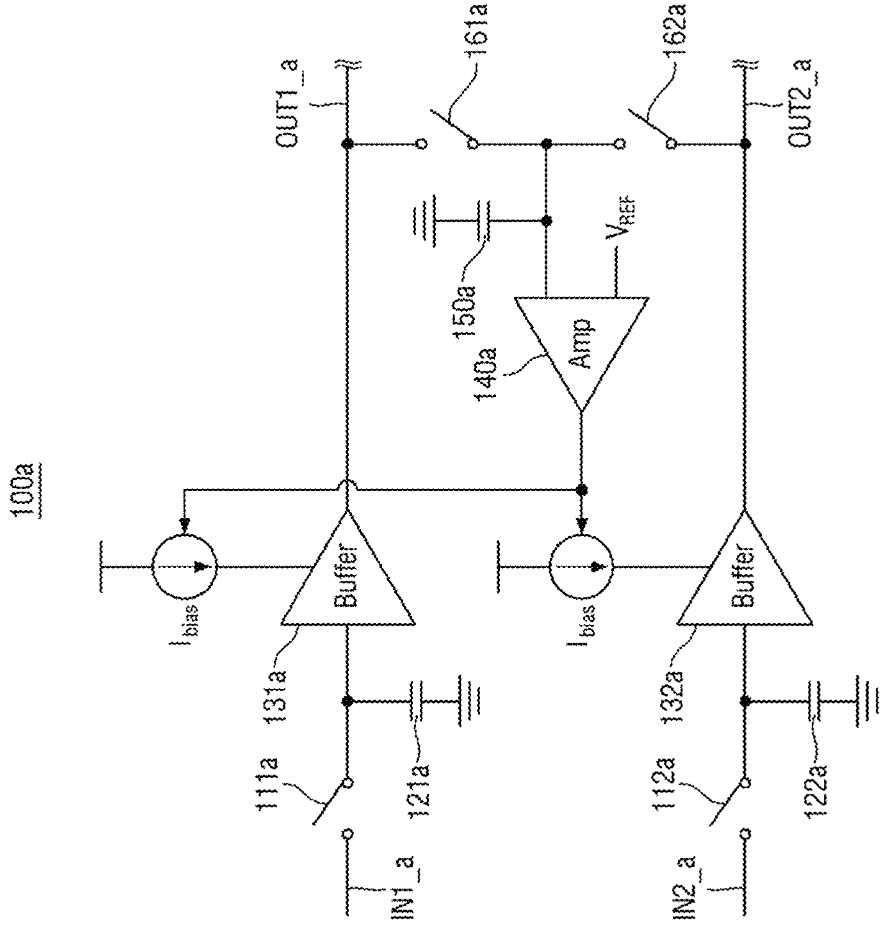
FIG. 7 is a circuit diagram of an example sample-and-hold circuit according to some embodiment of the present disclosure.

FIG. 7 is a circuit diagram of a sample-and-hold circuit. FIG. 7 illustrates a detailed circuit diagram of a sample-and-hold circuit where an amplifier outputs a feedback voltage to regulate the outputs of first and second unity gain buffers.

Referring to FIG. 7, a sample-and-hold circuit 100*a* may include first and second differential input terminals IN1_*a* and IN2_*a*, first and second sampling switches 111*a* and 112*a*, first and second unity gain buffers 131*a* and 132*a*, first and second sampling capacitors 121*a* and 122*a*, an amplifier 140*a*, a feedback capacitor 150*a*, first and second feedback switches 161*a* and 162*a*, and first and second differential output terminals OUT1_*a* and OUT2_*a*. The output terminal of the amplifier 140*a* may be directly connected to the first and second unity gain buffers 131*a* and 132*a*. The first unity gain buffer 131*a* may receive a feedback voltage, in addition to a first differential input voltage. The feedback voltage may regulate a bias current $I_{bias}$ of the first unity gain buffer 131*a*, thereby adjusting the output of the first unity gain buffer 131*a*. The same description may also be applicable to the second unity gain buffer 132*a*. The sample-and-hold circuit 100*a* may further include another buffer (not illustrated) to compensate for any input voltage loss that may be caused by load resistance.

Figure 8:
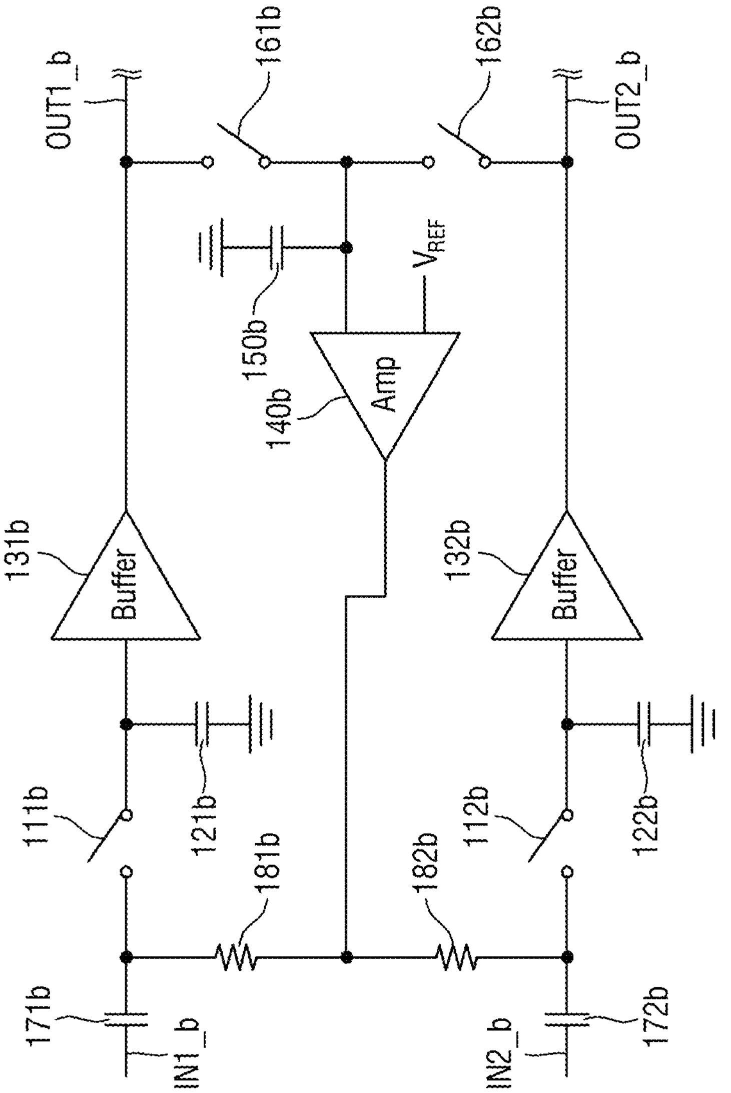
FIG. 8 is a circuit diagram of an example sample-and-hold circuit.

FIG. 8 is a circuit diagram of an example of a sample-and-hold circuit.

FIG. 8 illustrates a detailed circuit diagram of a different sample-and-hold circuit from that of FIG. 7, where an amplifier outputs a feedback voltage to regulate the output of first and second unity gain buffers.

Figure 9:
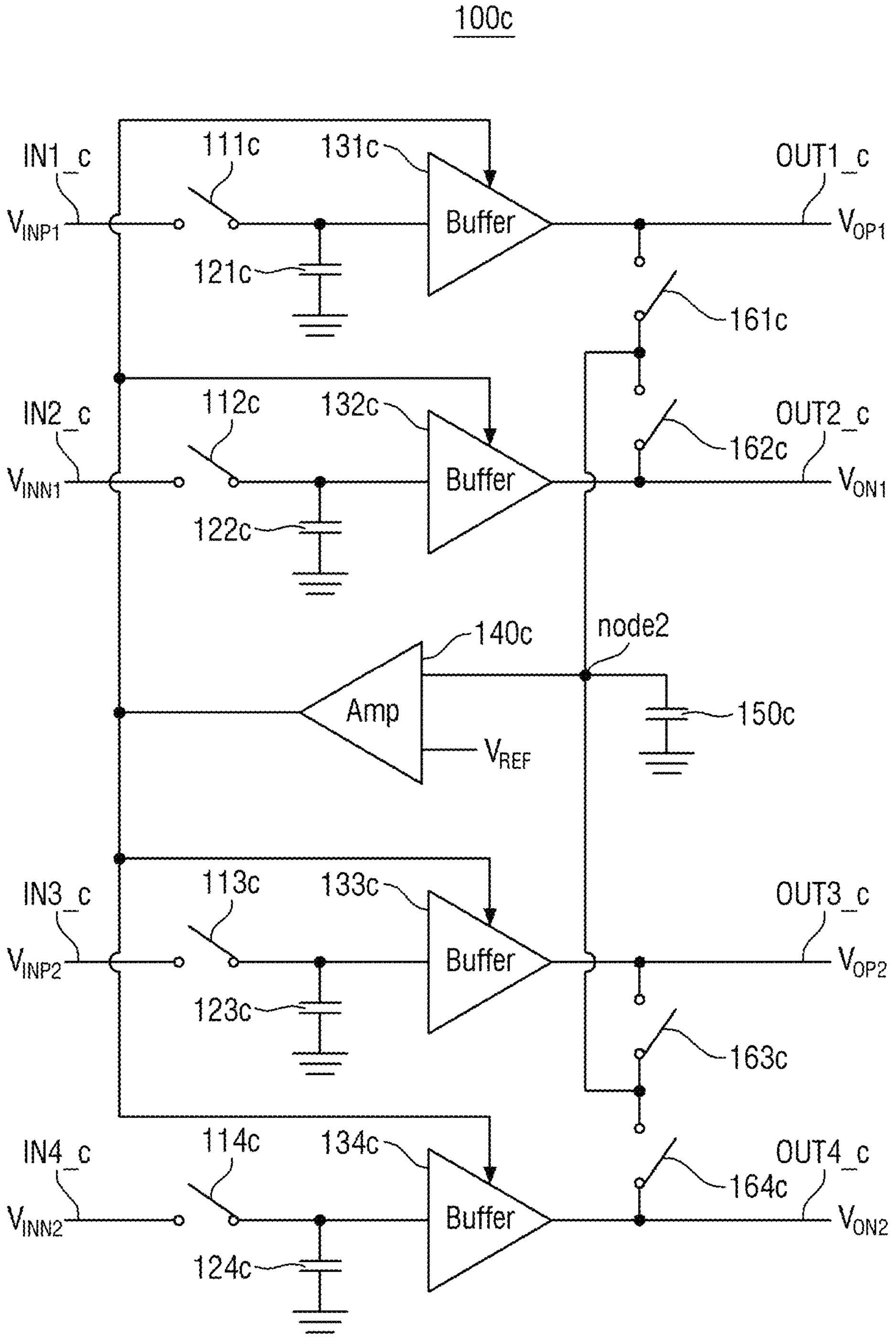
FIG. 9 is a circuit diagram of an example sample-and-hold circuit.

Referring to FIG. 8, a sample-and-hold circuit 100*b* may include first and second differential input terminals IN1_*b* and IN2_*b*, first and second sampling switches 111*b* and 112*b*, first and second unity gain buffers 131*b* and 132*b*, first and second sampling capacitors 121*b* and 122*b*, an amplifier 140*b*, a feedback capacitor 150*b*, first and second feedback switches 161*b* and 162*b*, and first and second differential output terminals OUT1_*b* and OUT2_*b*. Additionally, the sample-and-hold circuit 100*b* may also include first and second coupling capacitors 171*b* and 172*b* and first and second feedback resistors 181*b* and 182*b*. The first coupling capacitor 171*b* may be connected between the first differential input terminal IN1_*b* and the first sampling switch 111*b*. The second coupling capacitor 172*b* may be connected between the second differential input terminal IN2_*b* and the second sampling switch 112*b*. The first and second coupling capacitors 171*b* and 172*b* may block the DC components of differential input voltages. The output terminal of the amplifier 140*b* may split into two branches. One branch of the output terminal of the amplifier 140*b* may be connected to the first feedback resistor 181*b* and may also be connected between the first coupling capacitor 171*b* and the first sampling switch 111*b*. The other branch of the output terminal of the amplifier 140*b* may be connected to the second feedback resistor 182*b* and may also be connected between the second coupling capacitor 172*b* and the second sampling switch 112*b*. Consequently, the feedback voltage of the amplifier 140*b* may be provided to the first and second unity gain buffers 131*b* and 132*b* and may therefore regulate the differential output voltages of the first and second unity gain buffers 131*b* and 132*b*. FIG. 9 is a circuit diagram of a sample-and-hold circuit.

In some implementations, there may be two or more input channels. FIG. 9 depicts a sample-and-hold circuit with two input channels. However, the number of input channels is not particularly limited, and the implementation of FIG. 9 may be suitably modified to construct a sample-and-hold circuit with three or more input channels. Referring to FIG. 9, a sample-and-hold circuit 100*c* may include first and second differential input terminals IN1_*c* and IN2_*c*, first and second sampling switches 111*c* and 112*c*, first and second unity gain buffers 131*c* and 132*c*, first and second sampling capacitors 121*c* and 122*c*, an amplifier 140*c*, a feedback capacitor 150*c*, first and second feedback switches 161*c* and 162*c*, and first and second differential output terminals OUT1_*c* and OUT2_*c*. The sample-and-hold circuit 100*c* may also include third and fourth differential input terminals IN3_*c* and IN4_*c*, third and fourth differential output terminals OUT3_*c* and OUT4_*c*, third and fourth sampling switches 113*c* and 114*c*, and third and fourth unity gain buffers 133*c* and 134*c*. Third and fourth differential input voltage $V_{INP2}$ and $V_{INN2}$, which are different from each other, may be input to the third and fourth differential input terminals IN3_*c* and IN4_*c*.

The third and fourth sampling switches 113*c* and 114*c* may electrically connect or disconnect the third and fourth differential input terminals IN3_*c* and IN4_*c* to or from the third and fourth unity gain buffers 133*c* and 134*c*. When the third and fourth sampling switches 113*c* and 114*c* are closed, the third and fourth unity gain buffers 133*c* and 134*c* can receive the third and fourth differential input voltages $V_{INP2}$ and $V_{INN2}$. The sample-and-hold circuit 100*c* may further include third and fourth sampling capacitors 123*c* and 124*c*, which are connected between the third and fourth sampling switches 113*c* and 114*c* and the third and fourth unity gain buffers 133*c* and 134*c*. The third and fourth sampling capacitors 123*c* and 124*c* may sample the third and fourth differential input voltages $V_{INP2}$ and $V_{INN2}$ when the third and fourth sampling switches 113*c* and 114*c* are closed. The third and fourth sampling capacitors 123*c* and 124*c* may provide the sampled voltages to the third and fourth unity gain buffers 133*c* and 134*c* when the third and fourth sampling switches 113*c* and 114*c* are open.

The third and fourth unity gain buffers 133*c* and 134*c* may receive the third and fourth differential input voltages $V_{INP2}$ and $V_{INN2}$ or the voltages sampled by the third and fourth sampling capacitors 123*c* and 124*c* as inputs and may output third and fourth differential output voltages $V_{OP2}$ and $V_{ON2}$) to the third and fourth differential output terminals OUT3_*c* and OUT4_*c*.

FIG. 9 illustrates four unity gain buffers, i.e., the first, second, third, and fourth unity gain buffers 131*c*, 132*c*, 133*c*, and 134*c*, and accordingly, the sample-and-hold circuit 100*c* may include four feedback switches: first feedback switch 161*c*, second feedback switch 162*c*, third feedback switch 163*c*, and fourth feedback switch 161*c*. In implementations, the first feedback switch 161*c* is connected in series to the first unity gain buffer 131*c*. The second feedback switch 162*c* is connected in series to the second unity gain buffer 132*c* and the first feedback switch 161*c*. The third feedback switch 163*c* is connected in series to the third unity gain buffer 133*c* and the fourth feedback switch 164*c*. The fourth feedback switch 164*c* is connected in series to the fourth unity gain buffer 134*c* and the third feedback switch 163*c*. The first and second feedback switches 161*c* and 162*c* may be connected in series, and the third and fourth feedback switches 163*c* and 164*c* may be connected in series. The node between the first and second feedback switches 161*c* and 162*c* and the node between the third and fourth feedback switches 163*c* and 164*c* may be shorted to form a single node, i.e., a second node node2. When the first, second, third, and fourth feedback switches 161*c*, 162*c*, 163*c*, and 164*c* are closed, the output terminals of the first and second unity gain buffers 131*c* and 132*c* may be shorted, and the output terminals of the third and fourth unity gain buffers 133*c* and 134*c* may be shorted. Accordingly, when the first, second, third, and fourth feedback switches 161*c*, 162*c*, 163*c*, and 164*c* are closed, a common mode voltage may be generated at the second node node2. The sample-and-hold circuit 100*c* may further include a feedback capacitor 150*c*, which is connected between the second node node2 and the amplifier 140*c*. When the first, second, third, and fourth feedback switches 161*c*, 162*c*, 163*c*, and 164*c* are closed, the feedback capacitor 150*c* may store the common mode voltage generated at the second node node2. When the first, second, third, and fourth feedback switches 161*c*, 162*c*, 163*c*, and 164*c* are open, the feedback capacitor 150*c* may provide the stored common mode voltage to the amplifier 140*c*.

The amplifier 140*c* may have two input terminals. The amplifier 140*c* may be connected to the second node node2 and may receive a voltage from the second node node2 or from the feedback capacitor 150*c*. The amplifier 140*c* may receive a reference voltage $V_{REF}$ from a voltage source connected externally or internally to the sample-and-hold circuit 100*c*. The amplifier 140*c* may compare the two received voltages and may output a feedback voltage. The amplifier 140*c* may provide the feedback voltage to the first, second, third, and fourth unity gain buffers 131*c*, 132*c*, 133*c*, and 134*c*. Therefore, the amplifier 140*c* may regulate the outputs of the first, second, third, and fourth unity gain buffers 131*c*, 132*c*, 133*c*, and 134*c* based on the feedback voltage.

Figure 10:
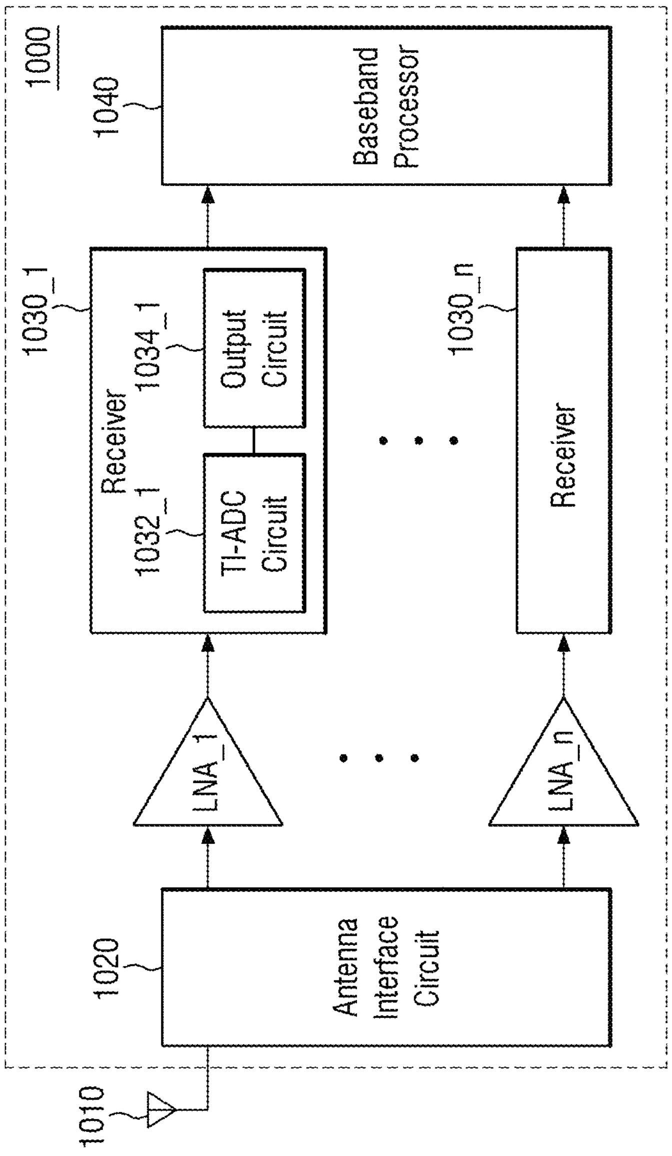
FIG. 10 is a block diagram of a wireless communication device to which sample-and-hold circuits and ADC circuits including the sample-and-hold circuits are applied.

FIG. 10 is a block diagram of an example wireless communication device to which sample-and-hold circuits and ADC circuits including the sample-and-hold circuits are applied.

Referring to FIG. 10, a wireless communication device 1000 may include an antenna 1010, an antenna interface circuit 1020, a plurality of low-noise amplifiers LNA_1 through LNA_n, a plurality of receivers 1030_1 through 1030_*n*, and a baseband processor 1040. The antenna interface circuit 1020 may route analog signals received through the antenna 1010 to any one of the receivers 1030_1 through 1030_*n*. The antenna interface circuit 1020 may include switch elements, duplexers, filter circuits, and input matching circuits. The low-noise amplifiers LNA_1 through LNA_n may perform low-noise amplification of the received analog signals and output the results of the amplification to the receivers 1030_1 through 1030_*n*. The baseband processor 1040 may receive digital signals from the receivers 1030_1 through 1030_*n* and may perform processing such as demodulation. The first receiver 1030_1 may include an ADC circuit 1032_1, to which a sample-and-hold circuit is applied, and an output circuit 1034_1. The ADC circuit 1032_1 may convert analog signals received from the first low-noise amplifier LNA_1 into digital signals. Furthermore, the ADC circuit 1032_1 may generate robust digital signals against PVT variations through a feedback operation. Additionally, the analog-to-digital converter circuit 1032_1 may not use passive elements to extract common mode voltage. Therefore, the analog-to-digital converter circuit 1032_1 can rapidly provide improved quality digital signals to the baseband processor 1040. The first receiver 1030_1 may be implemented to further include the first low-noise amplifier LNA_1. The output circuit 1034_1 may perform an operation for improving the quality of digital signals output from the ADC circuit 1032_1. For example, the output circuit 1034_1 may equalize digital signals based on at least one of continuous time linear equalization (CTLE), decision feedback equalization (DFE), and feed forward equalization (FFE). The aforementioned configuration of the first receiver 1030_1 may also be applicable to the other receivers 1030_2 through 1030_n.

Figure 11:
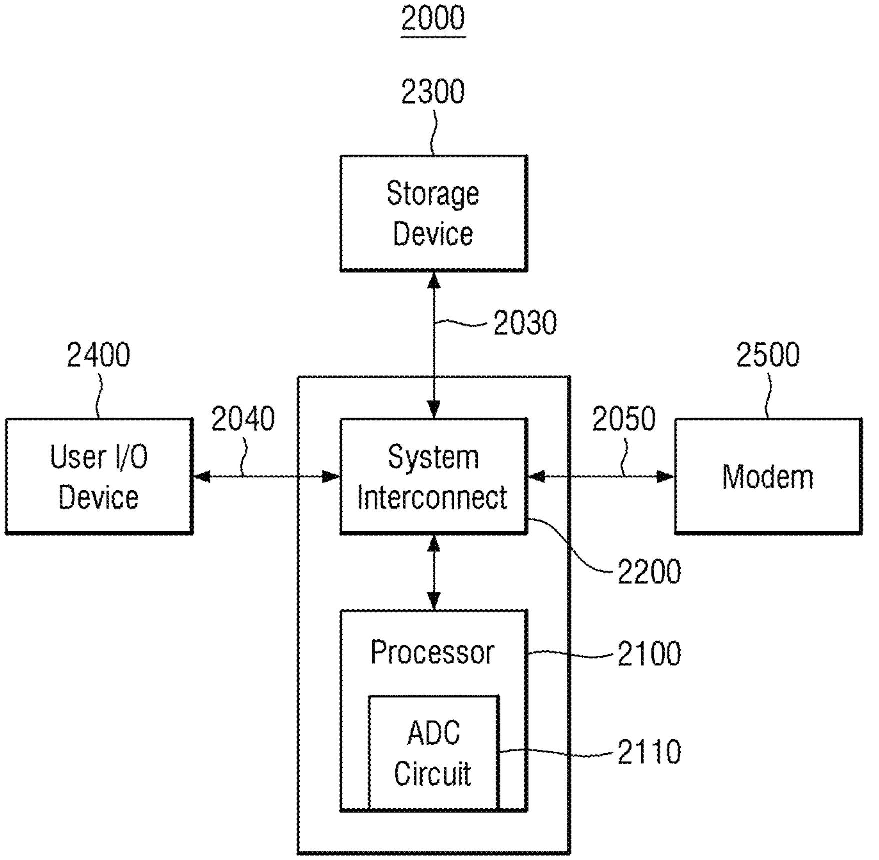
FIG. 11 is a block diagram of an exemplary computing system.

FIG. 11 is a block diagram of an exemplary computing system.

Referring to FIG. 11, a computing system 2000 may include a processor 2100, a system interconnect 2200, a storage device 2300, a user input/output (I/O) device 2400, and a modem 2500. The processor 2100, the system interconnect 2200, the storage device 2300, the user I/O device 2400, and the modem 2500 may be mounted on a single substrate (not illustrated). The storage device 2300, the user I/O device 2400, and the modem 2500 may be connected to the system interconnect 2200 through channels 2030, 2040, and 2050. The channels 2030, 2040, and 2050 may be based on one of various standards such as Peripheral Component Interconnect express (PCIe), Nonvolatile Memory express (NVMe), Advanced eXtensible Interface (AXI), ARM Microcontroller Bus Architecture (AMBA), etc.

The storage device 2300 may function as a memory for the computing system 2000. The storage device 2300 may store an operating system and applications driven by the processor 2100 and may also store original user data. The storage device 2300 may include a hard disk drive (HDD), a solid-state drive (SSD), an optical disk drive (ODD), etc. The user I/O device 2400 may be configured to exchange information with a user. The user I/O device 2400 may include a user input device, such as a keyboard, a mouse, a touch panel, a motion sensor, or a microphone, that receives information from the user. The user I/O device 2400 may also include a user output device, such as a display device, speakers, a beam projector, or a printer, that provides information to the user.

The modem 2500 may be configured to exchange data via a wireless or wired connection with an external device. Unlike in the implementation of FIG. 11, the modem 2500 may also be integrated with the processor 2100. The processor 2100 may include a central processing unit or application processor that controls the computing system 2000 and performs various operations. The processor 2100 may include an ADC circuit 2110 to which a sample-and-hold circuit is applied. The ADC circuit 2110 may convert analog signals received from the storage device 2300, the user I/O device 2400, and the modem 2500 through the system interconnect 2200 into digital signals. The ADC circuit 2110 may output improved quality digital signals that are robust against PVT variations through a feedback operation. Furthermore, the ADC circuit 2110 may not use passive elements to extract common mode voltage. Therefore, the ADC circuit 2110 can quickly provide improved quality digital signals to the processor 2100. In some implementations, the ADC circuit 2110 may also be implemented as part of the system interconnect 2200.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

Although implementations of the present disclosure have been described with reference to the accompanying drawings, implementations of the present disclosure are not limited to the above implementations, but may be implemented in various different forms. A person skilled in the art may appreciate that the present disclosure may be practiced in other concrete forms without changing the technical spirit or essential characteristics of the present disclosure. Therefore, it should be appreciated that the implementations as described above is not restrictive but illustrative in all respects.

What is claimed is:

1. A sample-and-hold circuit comprising:

a first differential input terminal configured to receive a first differential input voltage among differential input voltages;

a second differential input terminal configured to receive a second differential input voltage among the differential input voltages, which is different from the first differential input voltage;

a first unity gain buffer configured to receive the first differential input voltage from the first differential input terminal and to output a first differential output voltage to a first differential output terminal;

a second unity gain buffer configured to receive the second differential input voltage from the second differential input terminal and to output a second differential output voltage to a second differential output terminal; and an amplifier configured to compare received voltages and amplifying results of the comparison, wherein the amplifier is configured to compare a reference voltage and a common mode voltage generated by connecting output terminals of the first unity gain buffer and the second unity gain buffer, and to generate a feedback voltage based on a result of the comparison.

2. The sample-and-hold circuit of claim 1, further comprising:

a first sampling switch configured to connect to the first differential input terminal and the first unity gain buffer during a first phase and to disconnect from the first differential input terminal and the first unity gain buffer during a second phase; and a second sampling switch configured to connect to the second differential input terminal and the second unity gain buffer during the first phase and to disconnect from the second differential input terminal and the second unity gain buffer during the second phase.

3. The sample-and-hold circuit of claim 2, further comprising:

a first sampling capacitor connected between the first sampling switch and the first unity gain buffer; and a second sampling capacitor connected between the second sampling switch and the second unity gain buffer.

4. The sample-and-hold circuit of claim 3, wherein the sample-and-hold circuit is configured to sample the differential input voltages to the first and second sampling capacitors during the first phase, the first sampling capacitor is configured to provide a first sampled differential input voltage to the first unity gain buffer during the second phase, and the second sampling capacitor is configured to provide a second sampled differential input voltage to the second unity gain buffer during the second phase.

5. The sample-and-hold circuit of claim 1, further comprising:

a first feedback switch connected in series to the first unity gain buffer; and a second feedback switch connected in series to the second unity gain buffer and the first feedback switch.

6. The sample-and-hold circuit of claim 5, further comprising:

a feedback capacitor connected to a node between the amplifier, the first feedback switch, and the second feedback switch, wherein the feedback capacitor is configured to store the common mode voltage during a first phase, and to provide the stored common mode voltage to the amplifier during a second phase, which follows the first phase.

7. The sample-and-hold circuit of claim 1, further comprising:

a third differential input terminal configured to receive a third differential input voltage among the differential input voltages;

a fourth differential input terminal configured to receive a fourth differential input voltage among the differential input voltages, which is different from the third differential input voltage;

a third unity gain buffer configured to receive the third differential input voltage from the third differential input terminal and to output a third differential output voltage to a third differential output terminal; and a fourth unity gain buffer configured to receive the fourth differential input voltage from the fourth differential input terminal and to output a fourth differential output voltage to a fourth differential output terminal, and wherein the common mode voltage is generated by connecting the output terminals of the third unity gain buffer and the fourth unity gain buffer to the output terminals of the first unity gain buffer and the second unity gain buffer.

8. The sample-and-hold circuit of claim 1, wherein the amplifier is configured to control a first bias current of the first unity gain buffer by providing the feedback voltage to the first unity gain buffer, and to control a second bias current of the second unity gain buffer by providing the feedback voltage to the second unity gain buffer.

9. The sample-and-hold circuit of claim 1, further comprising:

a first coupling capacitor connected in series between the first differential input terminal and the first unity gain buffer; and a second coupling capacitor connected in series between the second differential input terminal and the second unity gain buffer, wherein an output terminal of the amplifier is connected between the first coupling capacitor and the first sampling switch and also between the second coupling capacitor and the second sampling switch.

10. A sample-and-hold circuit comprising:

a first differential input terminal configured to receive a first differential input voltage among differential input voltages;

a second differential input terminal configured to receive a second differential input voltage among the differential input voltages, which is different from the first differential input voltage;

a first unity gain buffer configured to receive the first differential input voltage from the first differential input terminal and to output a first differential output voltage to a first differential output terminal;

a second unity gain buffer configured to receive the second differential input voltage from the second differential input terminal and to output a second differential output voltage to a second differential output terminal;

a first feedback switch having one terminal connected to an output terminal of the first unity gain buffer;

a second feedback switch having one terminal connected to an output terminal of the second unity gain buffer and the other terminal connected to the first feedback switch; and an amplifier having a first input terminal connected to the first and second feedback switches, a second input terminal receiving a reference voltage, and an output terminal outputting a feedback voltage that regulates outputs of the first and second unity gain buffers; and a sampling capacitor connected to the first input terminal of the amplifier.

11. The sample-and-hold circuit of claim 10, further comprising:

a third differential input terminal configured to receive a third differential input voltage among the differential input voltages, wherein the third differential input voltage is different from the first and second differential input voltages;

a fourth differential input terminal configured to receive a fourth differential input voltage among the differential input voltages, which is different from the first, second, and third differential input voltages;

a third unity gain buffer configured to receive the third differential input voltage from the third differential input terminal and to output a third differential output voltage to a third differential output terminal;

a fourth unity gain buffer configured to receive the fourth differential input voltage from the fourth differential input terminal and to output a fourth differential output voltage to a fourth differential output terminal;

a third feedback switch having one terminal connected to an output terminal of the third unity gain buffer and a second terminal connected to the first input terminal of the amplifier; and a fourth feedback switch having one terminal connected to an output terminal of the fourth unity gain buffer and a second terminal connected to the first input terminal of the amplifier.

12. The sample-and-hold circuit of claim 10, further comprising:

a first sampling switch connected between the first differential input terminal and the first unity gain buffer; and a second sampling switch connected between the second differential input terminal and the second unity gain buffer.

13. The sample-and-hold circuit of claim 12, further comprising:

a first sampling capacitor connected between the first sampling switch and the first unity gain buffer; and a second sampling capacitor connected between the second sampling switch and the second unity gain buffer.

14. The sample-and-hold circuit of claim 10, further comprising:

a first coupling capacitor connected in series between the first differential input terminal and the first unity gain buffer; and a second coupling capacitor connected in series between the second differential input terminal and the second unity gain buffer, wherein the output terminal of the amplifier is connected between the first feedback switch the second feedback switch, and the amplifier.

15. The sample-and-hold circuit of claim 10, wherein the output terminal of the amplifier is connected to the first and second unity gain buffers.

16. An analog-to-digital converter (ADC) circuit comprising:

a plurality of sub-ADCs configured to convert analog signals into digital signals in a time-interleaving method; and a sample-and-hold circuit configured to repeatedly sample and buffer a first differential input voltage among differential input voltages by using a first unity gain buffer, and repeatedly sample and buffer a second differential input voltage among the differential input voltages, wherein the second differential input voltage is different from the first differential input voltage by using a second unity gain buffer, wherein in response to the first and second differential input voltages being sampled, the sample-and-hold circuit is configured to input a common mode voltage generated by connecting output terminals of the first unity gain buffer and the second unity gain buffer, to an amplifier and to regulate outputs of the first and second unity gain buffers based on the common mode voltage and a reference voltage, and in response to the first and second differential input voltages being buffered, the sample-and-hold circuit is configured to provide the regulated outputs of the first and second unity gain buffers to the sub-ADCs.

17. The ADC circuit of claim 16, wherein each of the sub-ADCs includes converter switches, in response to the first and second differential input voltages being buffered, the first and second unity gain buffers and the sub-ADCs are configured to be connected, and in response to the first and second differential input voltages being sampled, the first and second unity gain buffers and the sub-ADCs are configured to be disconnected.

18. The ADC circuit of claim 16, wherein the sample-and-hold circuit further comprises a feedback capacitor, which is connected to an input terminal that is configured to receive the common mode voltage from the amplifier, in response to the first and second differential input voltages being sampled, the sample-and-hold circuit is configured to store the common mode voltage in the feedback capacitor, and in response to the first and second differential input voltages being buffered, the feedback capacitor is configured to provide the stored common mode voltage to the amplifier.

* * * * *